United States Patent
Yamamoto et al.

(10) Patent No.: US 10,662,507 B2
(45) Date of Patent: May 26, 2020

(54) METHOD FOR PRODUCING A THERMOELECTRIC MATERIAL

(71) Applicant: TOYOTA JIDOSHA KABUSHIKI KAISHA, Toyota-shi, Aichi-ken (JP)

(72) Inventors: Hidenari Yamamoto, Gotenba (JP); Hiroyuki Suto, Susono (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 383 days.

(21) Appl. No.: 15/439,004

(22) Filed: Feb. 22, 2017

(65) Prior Publication Data
US 2017/0306445 A1  Oct. 26, 2017

(30) Foreign Application Priority Data
Apr. 22, 2016  (JP) .................. 2016-086379

(51) Int. Cl.
*C22C 1/04*  (2006.01)
*B22F 3/14*  (2006.01)
(Continued)

(52) U.S. Cl.
CPC .............. *C22C 1/0483* (2013.01); *B22F 3/14* (2013.01); *B22F 9/04* (2013.01); *C22C 13/00* (2013.01);
(Continued)

(58) Field of Classification Search
CPC ......... C22C 1/0483; C22C 13/00; B22F 3/14; B22F 9/04; B22F 2301/30; B22F 2998/10;
(Continued)

(56) References Cited

U.S. PATENT DOCUMENTS

2008/0295879 A1   12/2008  Atanackovic
2012/0118343 A1   5/2012   Iida et al.

FOREIGN PATENT DOCUMENTS

JP      04334832 A   *  11/1992
JP   2007-146283 A      6/2007
(Continued)

OTHER PUBLICATIONS

Double-Doping Approach to Enhancing the Thermoelectric Figure-of-Merit of n-Type Mg2Si Synthesized by Use of Spark Plasma Sintering Saravanan Muthiah-B. Sivaiah-B. Gahtori-K. Tyagi-A. Srivastava-B. Pathak-Ajay Dhar-R. Budhani—Journal of Electronic Materials—2014 (Year: 2014).*

(Continued)

*Primary Examiner* — John A Hevey
(74) *Attorney, Agent, or Firm* — Oliff PLC

(57) ABSTRACT

A method for producing a thermoelectric material, comprising: mixing an Sn powder and a powder containing a first dopant element to obtain a first mixed raw material, heating the first mixed raw material at a temperature allowing for mutual diffusion of Sn and the first dopant element to obtain a first aggregate, pulverizing the first aggregate to obtain a first powder, mixing an Mg powder, an Si powder, and the first powder to obtain a second mixed raw material, heating the second mixed raw material at a temperature allowing for mutual diffusion of Mg, Si, Sn and the first dopant element to obtain a second aggregate, pulverizing the second aggregate to obtain a second powder, and pressure-sintering the second powder, and wherein the first dopant element is one or more elements selected from Al, Ag, As, Bi, Cu, Sb, Zn, P, and B.

1 Claim, 5 Drawing Sheets

(51) Int. Cl.
    B22F 9/04      (2006.01)
    C22C 13/00     (2006.01)
    H01L 35/20     (2006.01)
    H01L 35/34     (2006.01)
    B22F 3/02      (2006.01)
(52) U.S. Cl.
    CPC .............. H01L 35/20 (2013.01); H01L 35/34 (2013.01); *B22F 3/02* (2013.01); *B22F 2301/052* (2013.01); *B22F 2301/058* (2013.01); *B22F 2301/30* (2013.01); *B22F 2302/45* (2013.01); *B22F 2998/10* (2013.01)
(58) Field of Classification Search
    CPC ................. B22F 3/02; B22F 2301/058; B22F 2301/052; B22F 2302/45; H01L 35/34; H01L 35/20
    See application file for complete search history.

(56) References Cited

FOREIGN PATENT DOCUMENTS

| | | |
|---|---|---|
| JP | 2009-068090 A | 4/2009 |
| JP | 2010-065245 A | 3/2010 |
| JP | 2011-049538 A | 3/2011 |
| JP | 2012-190984 A | 10/2012 |
| JP | 2015-110820 A | 6/2015 |

OTHER PUBLICATIONS

Wei Liu et al 2010 J. Phys. D: Appl. Phys. 43 085406 "Low-temperature solid state reaction synthesis and thermoelectric properties of high-performance and low-cost Sb-doped Mg2Si0.6Sn0.4" Feb. 12, 2010 (Year: 2010).*
Yoshioka, JP04-334832A, machine translation. (Year: 1992).*
Peng Gao et al.; "Transport and Mechanical Properties of High-ZT Mg2.08Si0.4-xSn0.6Sbx Thermoelectric Materials;" Journal of Electronic Materials; Dec. 10, 2013; vol. 43; No. 6; pp. 1790-1803.
U.S. Appl. No. 15/936,658, filed Mar. 27, 2018 in the name of Hirono.
Wei Liu et al., "Convergence of Conduction Bands as a Means of Enhancing Thermoelectric Performance of n-Type Mg2Si1-xSnx Solid Solutions," Physical Review Letters, Apr. 20, 2012, pp. 166601-1-166601-5, vol. 108.
K. Yin et al., "In Situ Nanostructure Design Leading To A High Figure Of Merit In An Eco-Friendly Stable Mg2Si0.30Sn0.70 Solid Solution", RSC Advances, vol. 6, (2016), pp. 16824-16831.
W. Liu et al., "Enhanced thermoelectric properties of n-type Mg2.16 (Si0.4Sn0.6)1-ySby due to nano-sized Sn-rich precipitates and an optimized electron concentration", J. Mater.Chem., vol. 22, (2012), pp. 13653-13661.
D.A. Pshenai-Severin et al., "The influence of grain boundary scattering on thermoelectric properties of Mg2Si and Mg2Si0.8Sn0.2," J. Electron. Mater., vol. 42, (2013), pp. 1707-1710.

* cited by examiner

METHOD FOR PRODUCING A
THERMOELECTRIC MATERIAL

TECHNICAL FIELD

The present invention relates to a method for producing a thermoelectric material. More specifically, the present invention relates to a method for producing a thermoelectric material containing Mg, Si, Sn, and a dopant element.

BACKGROUND ART

In order to effectively utilize heat emitted from factories, automobiles, electronic equipment, etc., a thermoelectric device that can convert heat energy to electric energy is being studied.

The material used for the thermoelectric device includes a thermoelectric material such as Mg—Si-based, Bi—Te-based, Pb—Te-based, Si—Ge-based and Fe—Si-based materials.

When a thermoelectric material contains a specific dopant, the performance of a thermoelectric device is enhanced. By containing a specific dopant element in the thermoelectric material, thermal conductivity is reduced, electrical conductivity is improved, and/or Seebeck coefficient is improved.

The Mg—Si-based thermoelectric material includes a thermoelectric material in which part of Si of magnesium silicide ($Mg_2Si$) is replaced by Sn. Enhancing the thermoelectric performance is being studied by containing a dopant element in such a thermoelectric material.

For example, Patent Document 1 discloses a thermoelectric material having a composition of $Mg_2Si_{1-x}L_xM_y$ (wherein L is either one of Sn and Ge, M is at least one member selected from Al, Ag, As, Cu, Sb, P, and B, x is from 0 to 0.5, and y is from 0 to 0.3).

RELATED ART

Patent Document

[Patent Document 1] Japanese Unexamined Patent Publication No. 2012-190984

SUMMARY OF THE INVENTION

Technical Problem

With respect to the thermoelectric material disclosed in Patent Document 1, an Mg powder, an Si powder, an L-containing powder, and an M-containing powder are mixed, the mixed powders are heated to obtain an aggregate, the aggregate is crushed to obtain a raw material powder of a thermoelectric material, and the raw material powder is sintered to obtain a thermoelectric material.

However, the present inventors have found that the thermoelectric material obtained in this way has a problem of low ZT, despite containing a dopant element.

The present invention has been made to solve the problems above. That is, an object of the present invention is to provide a method for producing a thermoelectric material, where with respect to a thermoelectric material containing Mg, Si, Sn and a dopant element, ZT can be improved by causing the dopant element to effectively act.

Solution to Problems

The present inventors have conducted many intensive studies to attain the object above and accomplished the present invention. The gist thereof is as follows.

<1> A method for producing a thermoelectric material, comprising:

(a) mixing an Sn powder and a powder containing a first dopant element to obtain a first mixed raw material, (b) heating the first mixed raw material at a temperature allowing for mutual diffusion of Sn and the first dopant element to obtain a first aggregate, (c) pulverizing the first aggregate to obtain a first powder, (d) mixing an Mg powder, an Si powder, and the first powder to obtain a second mixed raw material, (e) heating the second mixed raw material at a temperature allowing for mutual diffusion of Mg, Si, Sn and the first dopant element to obtain a second aggregate, (f) pulverizing the second aggregate to obtain a second powder, and (g) pressure-sintering the second powder, and wherein the first dopant element is one or more elements selected from Al, Ag, As, Bi, Cu, Sb, Zn, P, and B.

<2> The method according to item <1>, comprising:

in the step (d), further mixing a powder containing a second dopant element with the Mg powder, the Si powder and the first powder to obtain the second mixed raw material, and in the step (e), heating the second mixed raw material at a temperature allowing for mutual diffusion of Mg, Si, Sn, the first dopant element, and the second dopant element to obtain the second aggregate, and wherein the second dopant element is one or more elements selected from Al, Ag, As, Bi, Cu, Sb, Zn, P, and B.

<3> The method according to item <1> or <2>, wherein a holding temperature at a time of heating of the second mixed raw material in the step (e) is higher than a holding temperature at a time of heating of the first mixed raw material in the step (b).

<4> The method according to any one of items <1> to <3>, wherein a holding temperature at a time of heating of the first mixed raw material in the step (b) is lower than the melting point of Sn.

<5> The method according to any one of items <1> to <4>, further comprising compression-molding the first mixed raw material between the step (a) and the step (b).

<6> The method according to any one of items <1> to <5>, further comprising compression-molding the second mixed raw material between the step (d) and the step (e).

Effects of the Invention

According to the present invention, a method for producing a thermoelectric material, where the dopant element is uniformly diffused in the thermoelectric material by first mutually diffusing Sn and a dopant element and then mutually diffusing Mg, Si, Sn and the dopant element and ZT is thereby improved, can be provided.

EMBODIMENTS FOR CARRYING OUT THE INVENTION

The embodiment of the method for producing a thermoelectric material according to the present invention is described in detail below. However, the present invention is not limited to the following embodiment.

At the time of production of a thermoelectric material containing Mg, Si, Sn and a dopant element, the conventional technique includes a step of mixing an Mg powder, an Si powder, an Sn powder, and a dopant element-containing powder, and heating the mixture.

Figure 1:
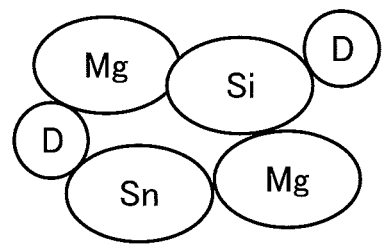
FIG. 1 A schematic view illustrating the state of an Mg powder, an Si powder, an Sn powder and a dopant element-containing powder being mixed.

FIG. 1 is a schematic view illustrating the state of an Mg powder, an Si powder, an Sn powder and a dopant element-containing powder being mixed. In FIG. 1, D indicates a dopant element-containing powder (hereinafter, sometimes referred to as "dopant powder").

The melting points of Mg, Si and Sn are 650° C., 1,414° C. and 232° C., respectively. In the case of mixing an Mg powder, an Si powder, an Sn powder, and a dopant powder to obtain a mixed powder, because of the low melting point of Sn, mutual diffusion of Sn and a dopant element easily occur between the Sn powder and the dopant powder.

When the mixture illustrated in FIG. 1 is heated, since the dopant powder on the left side in FIG. 1 is in contact with the Sn powder, mutual diffusion of Sn and a dopant element between the Sn powder and the dopant powder is facilitated. On the other hand, the dopant powder on the right side in FIG. 1 is not in contact with the Sn powder, and therefore even when the mixed powder illustrated in FIG. 1 is heated, Sn and a dopant element are not mutually diffused. Furthermore, it is difficult for the dopant element in the dopant powder on the right side in FIG. 1 to be diffused mutually with Mg and Si. Accordingly, the dopant powder on the right side in FIG. 1 easily remains as it is. The remaining dopant powder contains many dopant elements. As a result, the dopant element cannot be uniformly diffused in the thermoelectric material.

Without being bound by theory, when the dopant element is uniformly diffused in the thermoelectric material, ZT is enhanced. Without being bound by theory, the present inventors have found that in order to uniformly diffuse the dopant element in the thermoelectric material, this may be achieved by diffusing the dopant element in the following manner.

Figure 2:
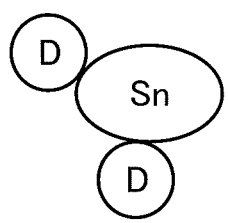
FIG. 2 A schematic view illustrating the state of an Sn powder and a dopant element-containing powder being mixed.
Figure 3:
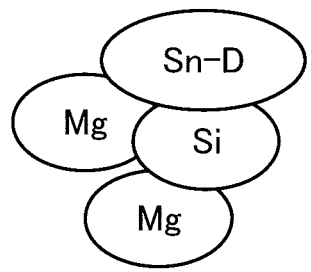
FIG. 3 A schematic view illustrating the state of an Sn powder having diffused thereinto a dopant element, an Mg powder, and an Si powder being mixed.

FIG. 2 is a schematic view illustrating the state of an Sn powder and a dopant element-containing powder (dopant powder) being mixed. FIG. 3 is a schematic view illustrating the state of an Sn powder having diffused thereinto a dopant element, an Mg powder, and an Si powder being mixed. In FIG. 3, Sn-D indicates an Sn powder having diffused thereinto a dopant element.

As illustrated in FIG. 2, when an Sn powder and a dopant powder are mixed without adding an Mg powder and an Si powder, compared with the case illustrated in FIG. 1, many of the dopant powder can come into mutual contact with an Sn powder. Accordingly, when the mixed raw material in the state of FIG. 2 is heated, a larger number of dopant elements are diffused into the Sn powder. Furthermore, a larger amount of Sn powder having diffused thereinto a dopant element is produced. As a result, the dopant element in the dopant powder can be prevented from remaining as a dopant powder without mutually diffusing with any of Mg, Si and Sn (see, the dopant powder on the right side in FIG. 1).

In the mixed raw material in the state of FIG. 3, out of an Mg powder, an Si powder, and an Sn powder having diffused thereinto a dopant element (Sn-D), the melting point of the Si powder is highest. When the mixed raw material in the state of FIG. 3 is heated, Mg, Sn, and a dopant element diffuse into the Si powder. The present inventors have found that this leads to uniform diffusion of a dopant element in the thermoelectric material.

The configuration of the method for producing a thermoelectric material according to the present invention based on these findings is described below.

The composition of the thermoelectric material obtained by the production method of the present invention is represented by $Mg_{2-p}Si_{1-x-q}Sn_{x-r}D_{p+q+r}$ (wherein D represents a dopant element, $0.10 \leq x \leq 0.90$, and $0.001 \leq p+q+r \leq 0.100$). The thermoelectric material represented by this composition formula contains a magnesium silicide ($Mg_2Si$) matrix with part of Si being replaced by Sn, and a dopant element added to the matrix. The substitution ratio of Si by Sn is x, and the amount added of the dopant element is, in number of moles, p+q+r. The dopant element may be two or more different elements, and in this case, the total amount added of all dopant elements is, in number of moles, p+q+r.

When the substitution ratio x of Si by Sn is from 0.10 to 0.90, desired properties of the thermoelectric material can be obtained. x may be 0.20 or more, 0.30 or more, 0.40 or more, or 0.50, and may be 0.85 or less, 0.80 or less, 0.75 or less, or 0.70. When the adding amount of the dopant element p+q+r is from 0.001 to 0.100, the effect from addition of the dopant element to the matrix is obtained. p+q+r may be 0.010 or more, 0.020 or more, or 0.030 or more, and may be 0.090 or less, 0.080 or less, or 0.070 or less.

The purity (the dopant is not counted as an impurity) of the thermoelectric material of the above-described composition is preferably as high as possible, and the purity is, for example, preferably 95% or more, more preferably 99% or more, still more preferably 99.9% or more in massa.

The production method of a thermoelectric material according to the present invention is described step by step below. In the following description, the powder containing a dopant element is classified, by the mixing timing, into a powder containing a first dopant element and a powder containing a second dopant element. The "powder containing a first dopant element" is sometimes referred to as "first dopant powder", and the "powder containing a second dopant element" is sometimes referred to as "second dopant powder".

<Step (a)>

An Sn powder and a first dopant powder are mixed to obtain a first mixed raw material. To do so, the Sn powder and the first dopant powder are weighed such that the composition of the thermoelectric material has the above-described composition. In the case where depletion of the Sn powder and/or first dopant powder occurs due to evaporation, etc. in the process of producing a thermoelectric material, the powders are weighed in excess to compensate for the depletion.

The purity of the Sn powder is not particularly limited as long as the concentration of an impurity (excluding the dopant; hereinafter, the same) in the thermoelectric material falls in the desired range. The purity of the Sn powder is, in mass %, preferably 99.9% (3N, three nines) or more. When the purity is 99.9% or more, the impurity concentration is prevented from increasing excessively. On the other hand, if the purity is too high, the economic efficiency is compromised. Accordingly, the purity is preferably 99.999% (5N, five nines) or less. In the following, unless otherwise indicated, the purity of the powder means mass %.

The first dopant element in the first dopant powder is one or more elements selected from Al, Ag, As, Bi, Cu, Sb, Zn, P, and B. In the case of containing two or more dopant elements as the first dopant element, the first dopant powder may be prepared by mixing two or more kinds of powders each containing a single first dopant element or may be a powder of an alloy or compound having two or more first dopant elements. For example, in the case of a powder containing Al and Cu, an Al powder and a Cu powder may be mixed, or the powder may be an Al—Cu alloy powder.

The purity of the first dopant powder is not particularly limited as long as the concentration of an impurity in the thermoelectric material falls in the desired range. The purity of the first dopant powder is preferably 95% or more. Since the first dopant powder is added in a small amount, when the purity is 95% or more, the impurity concentration in the thermoelectric material is prevented from increasing excessively. On the other hand, if the purity is too high, the economic efficiency is compromised. Accordingly, the purity is preferably 99.999% (5N, five nines) or less.

The particle diameters of the Sn powder and the first dopant powder are not particularly limited as long as when the Sn powder is put into contact with the first dopant powder and these powders are heated, the first dopant element in the first dopant powder can diffuse into the Sn powder. In particular, the particle diameters of the Sn powder and the first dopant powder are preferably of a size allowing for mutual solid-phase diffusion of Sn and a first dopant element. Furthermore, in order for a larger amount of the powder to come into contact with the Sn powder in the state illustrated in FIG. 2, the particle diameter of the Sn powder is preferably at the same level as that of the first dopant powder.

The particle diameter of the Sn powder is preferably from 1 to 100 μm in terms of the average particle diameter. When the average particle diameter of the Sn powder is 1 μm or more, the Sn powder does not easily aggregate. From this viewpoint, the average particle diameter of the Sn powder is more preferably 3 μm or more, still more preferably 5 μm or more. On the other hand, when the average particle diameter of the Sn powder is 100 μm or less, diffusion of a first dopant element into the Sn powder is facilitated. The particle diameter of the Sn powder is more preferably 80 μm or less, and in view of ease of solid-phase diffusion of a first dopant element into the Sn powder, still more preferably 50 μm or less.

The particle diameter of the first dopant powder is preferably from 1 to 100 μm in terms of the average particle diameter. When the average particle diameter of the first dopant powder is 1 μm or more, the first dopant powder does not easily aggregate. From this viewpoint, the average particle diameter of the first dopant powder is more preferably 3 μm or more, still more preferably 5 μm or more. On the other hand, when the average particle diameter of the first dopant powder is 100 μm or less, diffusion of a first dopant element into the Sn powder is facilitated. The particle diameter of the first dopant powder is more preferably 80 μm or less, and in view of ease of solid-phase diffusion of a first dopant element into the Sn powder, still more preferably 50 μm or less.

In the present invention, unless otherwise indicated, the average particle diameter conforms to the volume distribution median diameter (d(50)), and the average particle diameter is measured by the laser diffraction-type particle size distribution measuring method.

The method for mixing the Sn powder and the first dopant powder is not particularly limited as long as the Sn powder and the first dopant powder can be uniformly mixed. The method includes, for example, mixing in a mortar, and mixing using a ball mill, a mixer, and a blender, etc. In order to suppress oxidation, etc. of the powder, the powder may be mixed in an inert gas atmosphere, if necessary. The inert gas atmosphere encompasses a nitrogen gas atmosphere.

<Step (b)>

The first mixed raw material is heated at a temperature allowing for mutual diffusion of Sn and the first dopant element to obtain a first aggregate.

In the first mixed raw material, as illustrated in FIG. 2, the Sn powder is in contact with the first dopant powder. When the first mixed raw material is heated at a temperature allowing for mutual diffusion of Sn and the first dopant element, the first dopant element diffuses into the Sn powder.

The temperature allowing for mutual diffusion of Sn and the first dopant element includes the temperature in the case where Sn and the first dopant element are mutually diffused in the state of both being a solid phase, and the case where Sn and the first dopant element are mutually diffused in the state of at least either one being a liquid phase. As the heating temperature of the first mixed raw material, either case can be selected. In view of more uniform dispersion of the first dopant element in the Sn powder, it is preferable to select the case where Sn and the first dopant element are mutually diffused in the state of both being a solid phase.

The heating temperature is, in terms of the holding temperature, preferably from 100 to 800° C. The holding temperature as used herein means a temperature held in a certain temperature range during a predetermined time. When the holding temperature is 800° C. or less, most of the Sn powder and the first dopant powder can be prevented from evaporating during heating. From this viewpoint, the holding temperature is more preferably 600° C. or less, still more preferably 400° C. or less. When the holding temperature is 200° C. or less, Sn and the first dopant element are solid-phase diffused. From this viewpoint, the heating temperature is more preferably 200° C. or less. On the other hand, when the holding temperature is 100° C. or more, solid-phase diffusion of Sn and the first dopant element is facilitated. From this viewpoint, the holding temperature is preferably 120° C. or more, still more preferably 140° C. or more.

For example, in the case where the first dopant element is Al, since the eutectic temperature is 230° C. in an Sn—Al-based equilibrium phase diagram, the heating temperature is, in terms of the holding temperature, preferably 210° C. or less, more preferably 190° C. or less. In the case where the first dopant element is Zn, since the eutectic temperature is 200° C. in an Sn—Zn-based equilibrium phase diagram, the heating temperature is, in terms of the holding temperature, preferably 180° C. or less, more preferably 160° C. or less.

The temperature rise rate to the holding temperature is not particularly limited as long as an undesirable phase such as intermetallic compound is not produced in the course of raising the temperature. The temperature rise rate may be, for example, 0.1° C./min or more, 1° C./min or more, or 10° C./min or more. On the other hand, the temperature rise rate may be, for example, 100° C./min or less, 70° C./min or less, or 50° C./min or less.

The cooling rate from the holding temperature to 60° C. is not particularly limited as long as an undesirable phase such as metastable phase is not produced during cooling. The cooling rate may be, for example, 0.01° C./min or more, 0.1° C./min or more, or 1° C./min or more. On the other hand, the cooling rate may be, for example, 50° C./min or less, 25° C./min or less, or 10° C./min or less.

The heating time may be appropriately determined according to the particle diameter, mass, etc. of each of the Sn powder and the first dopant powder. The heating time as used herein means the time for which the raw material is held at the above-described holding temperature. The heating time may be, for example, 30 minutes or more, 1 hour or more, or 2 hours or more. On the other hand, the heating time may be, for example, 6 hours or less, 5 hours or less, or 4 hours or less.

In order to prevent the Sn powder and the first dopant powder from being oxidized during heating, the heating atmosphere is preferably a vacuum or an inert gas atmosphere. The inert gas atmosphere encompasses a nitrogen gas atmosphere. In addition, for activating the surface of each of the Sn powder and the first dopant powder, the heating atmosphere may also be a reducing atmosphere. The reducing atmosphere includes a hydrogen gas atmosphere. Furthermore, in order to suppress the depletion of Sn due to evaporation, a carbon crucible is preferably used at the time of heating.

When the Sn powder and the first dopant powder are heated, a first aggregate is obtained. In the first aggregate, the first dopant element is diffused into the Sn powder and the Sn powder is aggregated.

<Step (c)>

The first aggregate is pulverized to obtain a first powder. As for the first aggregate, the Sn powder is aggregated, and the first dopant element is diffused into the Sn powder. Pulverizing is an operation of dividing the aggregated Sn powder into individual Sn particles as much as possible. With regard to some Sn particles out of all Sn particles, one Sn particle may be further fragmented into two or more pieces.

Even when an Mg powder and an Si powder are mixed with the first aggregate, the Sn powder present inside the first aggregate cannot come into contact with the Mg powder and the Si powder. Accordingly, by pulverizing the first aggregate, the aggregated Sn powder is divided into individual Sn particles as much as possible to obtain a first powder.

The method for pulverizing is not particularly limited and includes a method using a mortar, a ball mill, a rod mil, a cutter mill, etc. In order to suppress oxidation of the first aggregate and first powder, pulverizing may be performed in an inert gas atmosphere, if necessary. The inert gas atmosphere encompasses a nitrogen gas atmosphere.

<Step (d)>

An Mg powder, an Si powder, and the first powder are mixed to obtain a second mixed raw material. The Mg powder, the Si powder, and the first powder are weighed such that the thermoelectric material has the above-described composition. The method for mixing is the same as in the case of obtaining the first mixed powder. In the case where depletion of the Mg powder, Si powder and first powder occurs due to evaporation, etc. in the process of producing a thermoelectric material, the each powder is weighed in excess to compensate for the depletion. In particular, Mg has a high vapor pressure, and therefore Mg is preferably weighed in excess to compensate for the depletion.

The purity of the Mg powder is not particularly limited as long as the concentration of an impurity in the thermoelectric material falls in the desired range. The purity of the Mg powder is preferably 99% (2N, two nines) or more in mass %. When the purity is 99% or more, the impurity concentration in the thermoelectric material is prevented from increasing excessively. On the other hand, if the purity is too high, the profitability is compromised. Accordingly, the purity is preferably 99.9% (3N, three nines) or less.

The purity of the Si powder is not particularly limited as long as the concentration of an impurity in the thermoelectric material falls in the desired range. The purity of the Si powder is preferably 99% (2N, two nines) or more in mass. When the purity is 99% or more, the impurity concentration in the thermoelectric material is prevented from increasing excessively. On the other hand, if the purity is too high, the profitability is compromised. Accordingly, the purity is preferably 99.99% (4N, four nines) or less.

The particle diameters of the Mg powder, the Si powder and the first powder are not particularly limited as long as when the Mg powder, the Si powder and the first powder are put into contact with each other and these powders are heated, Mg, Sn and the first dopant element can be mutually diffused into the Si powder.

In the second raw material powder, as illustrated in FIG. 3, the Mg powder, the Si powder, and the Sn powder having diffused thereinto a first dopant element (first powder) are mixed with each other. In order for Mg, Si, Sn and the first dopant element to sufficiently diffuse mutually due to the later-described heating, the Mg powder, the Si powder and the first powder are preferably put into contact with each other in the state illustrated in FIG. 3. To do so, the particle diameters of the Mg powder, the Si powder and the first powder are preferably at the same level. Furthermore, it is also preferable to take into account the reactivity during heating.

The particle diameter of the Mg powder is preferably from 10 to 500 µm in terms of the average particle diameter. Mg exhibits high reactivity when heated, and therefore, if the particle diameter of the Mg powder is too small, Mg may be rapidly activated, making it difficult for the Mg powder to diffuse into the Si powder. When the average particle diameter of the Mg powder is 10 µm or more, Mg can be prevented from becoming difficult to diffuse into the Si powder due to a rapid reaction. From this viewpoint, the average particle diameter of Mg is more preferably 100 µm or more. On the other hand, when the average particle diameter of the Mg powder is 500 µm or less, the Mg powder, the Si powder and the first powder are easily put into contact with each other. From this viewpoint, the average particle diameter of the Mg powder is more preferably 500 µm or less, still more preferably 200 µm or less.

The particle diameter of the Si powder is preferably from 5 to 100 µm in terms of the average particle diameter. When the average particle diameter of the Si powder is 5 µm or more, the Si powder does not easily aggregate at the time of mixing, and therefore the Si powder, the Mg powder and the first powder are easily mixed with each other. From this viewpoint, the average particle diameter of the Si powder is more preferably 20 μm or more. On the other hand, when the average particle diameter of the Si powder is 100 μm or less, the Mg powder, the Si powder and the first powder are easily put into contact with each other. From this viewpoint, the average particle diameter of the Si powder is more preferably 80 μm or less.

The particle diameters of the Sn powder and the dopant powder are preferably selected so that the particle diameter of the first powder can be at the same level as the particle diameters of the Mg powder and the Si powder.

In the first powder, it is preferable that an individual Sn particle is divided as much as possible, and the first dopant element is diffused into the Sn powder. In the second mixed raw material, the Mg powder, the Si powder and the first powder are into contact with each other, and therefore when the second mixed raw material is heated, Mg, Si and the first dopant element are easily diffused.

<Step (e)>

The second mixed raw material is heated at a temperature allowing for mutual diffusion of Mg, Si, Sn and the first dopant element to obtain a second aggregate.

FIG. 3 is a schematic view illustrating the state where, as described above, the Mg powder, the Si powder and the Sn powder having diffused thereinto a first dopant element (first powder) are mixed. That is, FIG. 3 illustrates the stage before heating the second mixed raw material.

In the second mixed raw material, the Mg powder, the Si powder and the first powder are put into contact with each other, and therefore, when the second mixed raw material is heated at a temperature allowing for mutual diffusion of Mg, Si, Sn and the first dopant element, Mg, Sn and the first dopant element diffuse into the Si powder. Without being bound by theory, it is thought that the inside of the Si powder is divided into an Mg site, an Si site and an Sn site and that the first dopant element is present mainly in the Si site; when the Si site is saturated, the first dopant is present in the Mg site; and when the Mg site is saturated, the first dopant element present in the Sn site. In the above-described composition of the thermoelectric material, p, q and r are considered to be the amounts of the first dopant element present in these sites. Incidentally, when the dopant element is classified into a first dopant element and a second dopant element by the mixing timing of the dopant powder, p, q and r are considered to be the amounts of first dopant element and second dopant element present in these sites.

The temperature allowing for mutual diffusion of Mg, Si, Sn and the first dopant element includes the following two cases, i.e., a case where the temperature is a temperature at which Mg, Si, Sn and the first dopant element are mutually diffused in the state of all being a solid phase, and a case where the temperature is a temperature at which Sn and the first dopant element are mutually diffused in the state of either one being a liquid phase. As the heating temperature of the second mixed raw material, either case can be selected. Since the melting point of Si is very high, mutual diffusion of Si with Mg, Sn and the first dopant element is difficult. As the heating temperature of the second mixed raw material, it is preferable to select a temperature at which Mg melts.

The heating temperature is, in terms of the holding temperature, preferably from 670 to 800° C. The holding temperature as used herein means a temperature held in a certain temperature range during a predetermined time. When the holding temperature is 800° C. or less, the progress of diffusion cannot be suppressed. The progress of diffusion is suppressed by evaporation of Mg during heating and sintering. From this viewpoint, the holding temperature is more preferably 775° C. or less, still more preferably 750° C. or less, yet still more preferably 725° C. or less. On the other hand, when the holding temperature is 670° C. or more, the Mg powder melts. From this viewpoint, the holding temperature is preferably 690° C. or more, still more preferably 710° C. or more.

The temperature rise rate to the holding temperature is not particularly limited as long as an undesirable phase such as intermetallic compound is not produced in the course of raising the temperature. The temperature rise rate may be, for example, 0.1° C./min or more, 1° C./min or more, or 10° C./min or more. On the other hand, the temperature rise rate may be, for example, 100° C./min or less, 70° C./min or less, or 50° C./min or less.

The cooling rate from the holding temperature to 500° C. is not particularly limited as long as an undesirable phase such as metastable phase is not produced during cooling. The cooling rate may be, for example, 1° C./min or more, 10° C./min or more, or 50° C./min or more. On the other hand, the cooling rate may be, for example, 200° C./min or less, 150° C./min or less, or 100° C./min or less.

The heating time may be appropriately determined according to the particle diameter, mass, etc. of each of the Mg powder, the Si powder and the first powder. The heating time as used herein means the time for which the raw material is held at the above-described holding temperature, and excludes the temperature rise time and the cooling time. The heating time may be 6 hours or more, 8 hours or more, or 10 hours or more. On the other hand, the heating time may be 18 hours or less, 16 hours or less, or 14 hours or less.

In order to prevent the oxidation of Mg powder, Si powder and first powder, the heating atmosphere is preferably a vacuum or an inert gas atmosphere. The inert gas atmosphere encompasses a nitrogen gas atmosphere. In addition, for activating the surface of each of the Mg powder, the Si powder and the first powder during the heating, the heating atmosphere may also be a reducing atmosphere. The reducing atmosphere includes a hydrogen gas atmosphere. Furthermore, in order to suppress the depletion of Mg due to evaporation, a carbon crucible is preferably used at the time of heating.

When the Mg powder, the Si powder, the Sn powder and the first powder are heated in this way, a second aggregate is obtained. In the second aggregate, Mg, Sn and the first dopant element are diffused into the Si powder and the Si powder is aggregated.

<Step (f)>

The second aggregate is pulverized to obtain a second powder. As for second aggregate, the Si powder is aggregated, and Mg, Sn and the first dopant element are diffused into the Si powder. Pulverizing is an operation of dividing the aggregated Si powder into individual Si particles as much as possible. With regard to some Si particles out of all Si particles, one Si particle may be further fragmented into two or more pieces. The method for pulverizing may be the same as the method for crushing the first aggregate.

As described above, the progress of diffusion is inhibited by sintering. In order to diffuse Mg, Sn and the first dopant element into the Si powder, the second mixed raw material is heated to an extent causing no sintering. The thus-obtained second aggregate is brittle for use as a thermoelectric material. Accordingly, the second aggregate is pulverized to obtain a second powder, and the second powder is pressure-sintered to obtain a robust thermoelectric material.

<Step (g)>

The second powder obtained as above is pressure-sintered. The method for pressure-sintering is not particularly limited and includes, for example, hot press sintering and Spark Plasma Sintering (SPS). In the spark plasma sintering, the temperature can be rapidly raised to the predetermined temperature. To do so, production of an undesirable phase such as intermetallic compound in the course of raising the temperature is suppressed. For this reason, the spark plasma sintering is preferred.

The sintering atmosphere is not particularly limited as long as the required sintered body is obtained, but in order to suppress oxidation of the second powder during sintering, a vacuum or an inert gas atmosphere is preferred. The inert gas atmosphere encompasses a nitrogen gas atmosphere. For more unfailingly suppressing the oxidation, sintering may also be performed in a reducing atmosphere, if necessary. The reducing atmosphere includes a hydrogen gas atmosphere.

The sintering temperature, the sintering pressure, the sintering time, etc. are not particularly limited as long as the required sintered body is obtained. In the case of spark plasma sintering, the following conditions are preferred. The sintering temperature is, in terms of the holding temperature, preferably 600° C. or more, 650° C. or more, or 700° C. or more, and preferably 1,000° C. or less, 900° C. or less, or 800° C. or less. The holding temperature as used herein means a temperature held in a certain temperature range during a predetermined time. The sintering pressure is preferably 5 MPa or more, 10 MPa or more, or 20 MPa or more, and preferably 60 MPa or less, 50 MPa or less, or 40 MPa or less. The sintering time is, in terms of the holding time at the holding temperature, preferably 5 minutes or more, 10 minutes or more, or 15 minutes or more, and preferably 60 minutes or less, 40 minutes or less, or 30 minutes or less. By sintering the powder under these conditions, a sintered body without an unsintered portion is obtained, and in addition, the performance of the thermoelectric material cannot be deteriorated. The performance of the thermoelectric material is deteriorated due to depletion of Mg.

The production method of a thermoelectric material of the present invention may be modified as follows, if necessary.

<Mixing of Powder Containing Second Dopant Element in Step (d)>

In the step (d), a powder containing a second dopant element (hereinafter, sometimes referred to as "second dopant powder") may be further mixed with the Mg powder, the Si powder and the first powder to obtain the second mixed raw material. After that, in the step (e), the second mixed raw material may be heated at a temperature allowing for mutual diffusion of Mg, Si, Sn, the first dopant element and the second dopant element to obtain the second aggregate.

As long as the second dopant element is one or more elements selected from Al, Ag, As, Bi, Cu, Sb, Zn, P, and B, the second dopant element may be the same as or different from the first dopant.

In the case of further mixing the second dopant powder in the step (d), the purity, particle diameter, etc. of the second dopant powder conform to the purity, particle diameter, etc. of the first dopant powder in the step (a). In the case of further mixing the second dopant powder in the step (d), various conditions conform to those in the case of not mixing the second dopant powder.

In the step (e), when heating the second mixed raw material at a temperature allowing for mutual diffusion of Mg, Si, Sn, the first dopant element and the second dopant element, various preferable conditions conform to those in the case of not mixing the second dopant powder. More specifically, the heating temperature, the temperature rise rate, the cooling rate, the heating time, the heating atmosphere, etc. conform to those in the case of not mixing the second dopant powder.

The second dopant element has not passed through the steps (a), (b) and (c), and therefore, except for part of the second dopant element in the second dopant powder, does not diffuse into any of Mg, Si and Sn but remains as it is in the second aggregate. This remaining second dopant element exerts no function as a dopant. However, part of the second dopant element diffuses into the Si powder together with Mg and Sn, and this part of the second dopant element exerts a function as a dopant and contributes to the enhancement of ZT of the thermoelectric material.

The second dopant element that is relatively less likely to remain as it is in the second aggregate includes Sb.

<Relationship of Holding Temperatures in Step (b) and Step (e)>

The holding temperature at the time of heating of the second mixed raw material in the step (e) may be higher than the holding temperature at the time of heating of the first mixed raw material in the step (b).

As described above, in the step (b), the heating temperature of the first mixed raw material is not particularly limited as long as it is a temperature allowing for mutual diffusion of Sn and the first dopant element. In the step (e), the heating temperature of the second mixed raw material is not particularly limited as long as it is a temperature allowing for mutual diffusion of Mg, Si, Sn and the first dopant element.

However, since the melting point of Si is very high, it is difficult for Mg, Sn and the first dopant element to diffuse into the Si powder. When the holding temperature at the time of heating of the second mixed raw material in the step (e) is set to be higher than the holding temperature at the time of heating of the first mixed raw material in the step (b), diffusion of Mg, Sn and the dopant element into the Si powder is more facilitated. The same applies to the case where a second dopant powder is further mixed to obtain a second mixed raw material in the step (d) and the second mixed raw material is heated in the step (e).

<Holding Temperature in Step (b)>

As described above, in the step (b), from the viewpoint of uniform diffusion of the first dopant element into the Sn powder, a temperature at which Sn and the first dopant element are mutually diffused in the state of both being a solid phase is preferably selected as the heating temperature of the first mixed raw material. More specifically, the holding temperature at the time of heating of the first mixed raw material is preferably a temperature allowing for mutual diffusion of Sn and the first dopant element and being lower than the melting point of Sn.

<Compression Molding of First Mixed Raw Material>

The production method may further comprise compression-molding the first mixed raw material between the step (a) and the step (b).

In the first mixed raw material, as illustrated in FIG. 2, the Sn powder is in contact with the first dopant powder. When the first mixed raw material is compression-molded, the Sn powder is more unfailingly put into contact with the first dopant powder. As a result, the first dopant element more easily diffuses into the Sn powder, and a thermoelectric material having more uniformly diffused therein the first dopant element is obtained.

The method for compression molding is not particularly limited as long as it is a method not using a binding material. The method includes, for example, press molding using a mold. The compressive force is not particularly limited as long as a green compact can be produced. The molding pressure includes 10 MPa or more, 20 MPa or more, or 40 MPa or more, and includes 300 MPa or less, 150 MPa or less, or 75 MPa or less.

<Compression Molding of Second Mixed Raw Material>

The production method may further includes compression-molding the second mixed raw material between the step (d) and the step (e).

In the second mixed raw material, as illustrated in FIG. 3, the Mg powder, the Si powder, and the first powder are in contact with each other. When the second mixed raw material is compression-molded, the Mg powder, the Si powder and the first powder are more unfailingly put into contact with each other. As a result, Mg, Sn and the first dopant element more easily diffuse into the Si powder, and a thermoelectric material having more uniformly diffused therein the first dopant element is obtained. The same effect is obtained also in the case of further mixing a second dopant powder in the step (d).

The method for compression molding may be the same as in the case of the first green compact.

EXAMPLES

The present invention is described more specifically below by referring to Examples. However, the present invention is not limited to the conditions employed in the following Examples.

Example 1

The sample of Example 1 was prepared as follows. 3.5212 g of Sn powder and 0.0388 g of Zn powder were weighed in a glove box, and the powder was mixed in a mortar to obtain a first mixed raw material. The Zn powder was mixed as a first dopant powder. As for the Sn powder, SNE08PB (purity: 99.99% (4N), average particle diameter: 38 μm or less) produced by Kojundo Chemical Laboratory Co., Ltd. was used. As for the Zn powder, ZNE06PB (purity: 99.99% (4N), average particle diameter: 75 μm or less) produced by Kojundo Chemical Laboratory Co., Ltd. was used. The first mixed raw material was charged into a mold and compression-molded in a pellet shape under a pressure of 100 MPa to obtain a first green compact.

Figure 4:
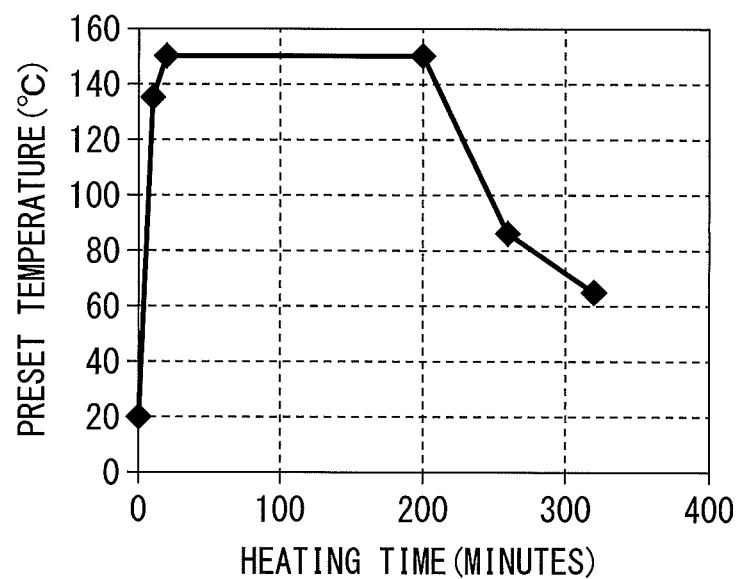
FIG. 4 A view showing a heating pattern of a first green compact in Examples 1 and 2.

The first green compact was charged into a carbon crucible and after charging the carbon crucible into a stainless steel-made pressure-resistant vessel, the inside of the pressure-resistant vessel was set to have a hydrogen atmosphere (atmospheric pressure). Thereafter, the pressure-resistant vessel was heated according to the pattern shown in FIG. 4 by using a heating furnace. As shown in FIG. 4, the holding temperature was 150° C., and the holding time was 180 minutes. Since the eutectic temperature is 200° C. in a binary equilibrium phase diagram of Sn—Zn system, it is considered that Zn had solid-phase diffused into the Sn powder.

After the completion of heating, the pressure-resistant vessel was opened in the glove box, the carbon crucible was taken out, and a first aggregate was collected from the carbon crucible. The first aggregate was pulverized using the mortar to obtain a first powder.

2.500 g of Mg powder, 0.5055 g of Si powder, and 0.1445 g of Sb powder were weighed, and the powder was mixed with the first powder in the mortar to obtain a second mixed raw material. The Sb powder was mixed as a second dopant powder. As for the Mg powder, MGB02PB (purity: 99.5% (2N5), average particle diameter: 180 μm or less) produced by Kojundo Chemical Laboratory Co., Ltd. was used. As for the Si powder, SIE19PB (purity: 99.9% (3N) or more, average particle diameter: 45 μm or less) produced by Kojundo Chemical Laboratory Co., Ltd. was used. As for the Sb powder, SBE13PB (purity: 99% (2N), average particle diameter: 38 μm or less) produced by Kojundo Chemical Laboratory Co., Ltd. was used.

Figure 5:
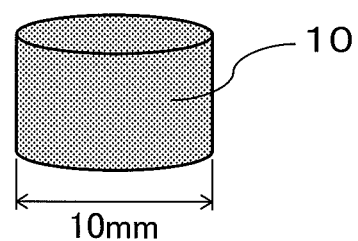
FIG. 5 A perspective view illustrating the shape of a second green compact.

The second mixed raw material was charged into a mold and compression-molded in a pellet shape under a pressure of 100 MPa to obtain a second green compact. FIG. 5 is a perspective view illustrating the shape of the second green compact. As illustrated in FIG. 5, the diameter of the second green compact 10 was 10 mm.

Figure 6:
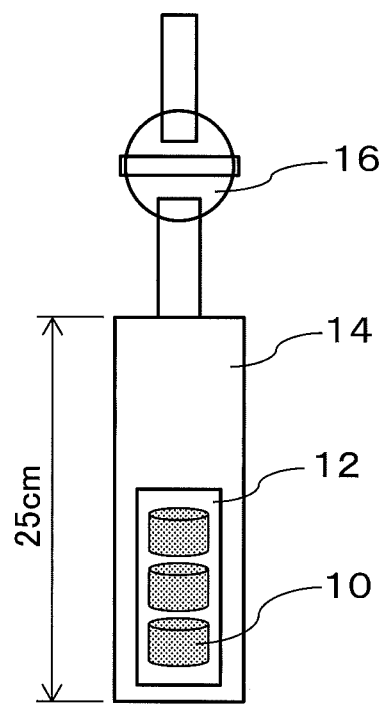
FIG. 6 A schematic view illustrating an outline of the method of sealing a second green compact in a quartz tube.

FIG. 6 is a schematic view illustrating an outline of the method for sealing the second green compact in a quartz tube. The second green compact 10 was charged into a carbon crucible 12, and the carbon crucible 12 was charged into a quartz tube 14. Thereafter, the inside of the quartz tube 14 was depressurized to 10 kPa by operating an on-off valve 16 connected to a vacuum pump (not illustrated), and the quartz tube 14 was then sealed up.

Figure 7:
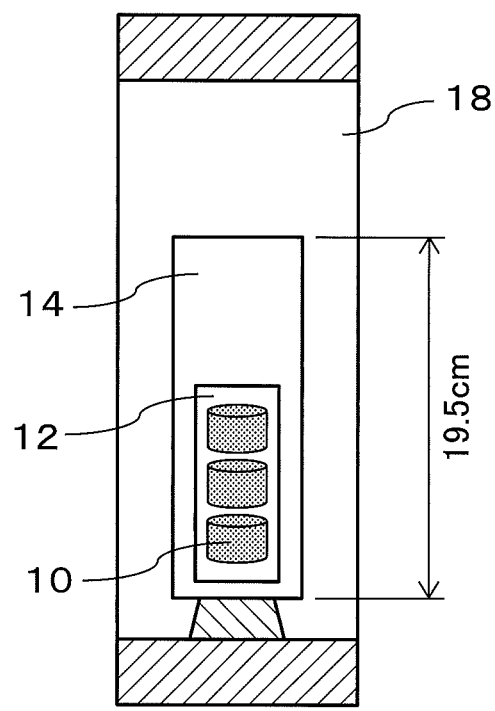
FIG. 7 A schematic view illustrating the state of a quartz tube being charged into a stainless steel-made pressure-resistant vessel.
Figure 8:
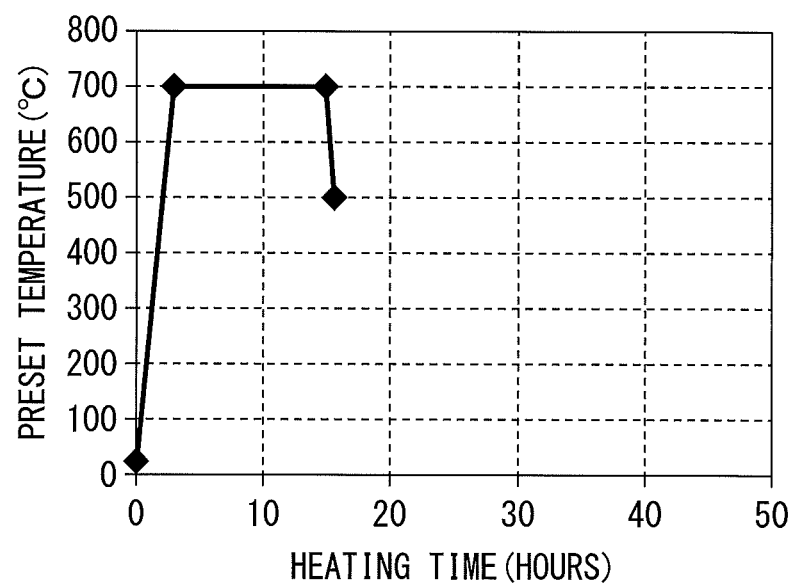
FIG. 8 A view showing a heating pattern of a second green compact.

FIG. 7 is a schematic view illustrating the state of the quartz tube being charged into a stainless steel-made pressure-resistant vessel. The quartz tube 14 sealed up was charged into a stainless steel-made pressure-resistant vessel 18, and the pressure-resistant vessel 18 was heated according to the pattern of FIG. 8 by using a SILICONIT furnace (not illustrated). As shown in FIG. 8, the holding temperature (temperature in the furnace) was 700° C., and the holding time was 12 hours.

After the completion of heating, the pressure-resistant vessel was opened in a glove box, the quartz tube was broken down, and a second aggregate was collected. The second aggregate was pulverized using the mortar during 10 minutes to obtain a second powder.

Figure 9:
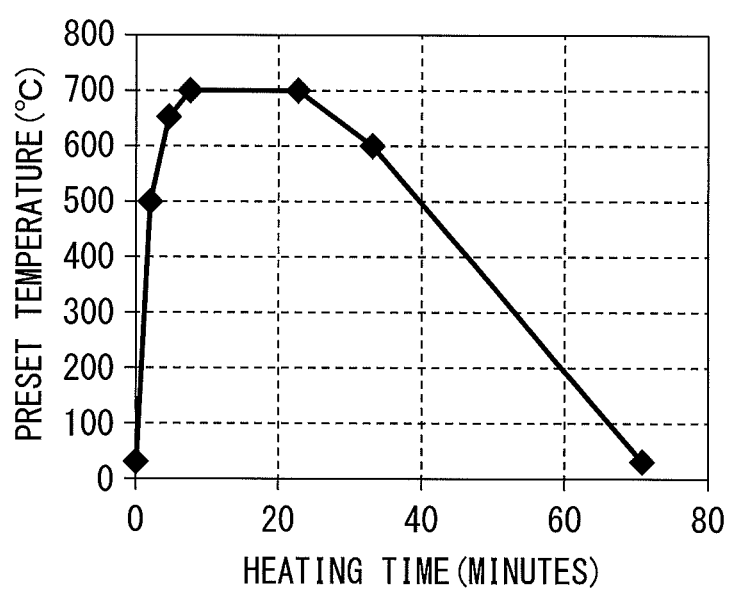
FIG. 9 A view showing a heating pattern at the time of pressure sintering.

10 g of the second powder was charged into a die having a diameter of 15 mm and sintered by SPS while applying pressure to a lid by a punch, to obtain a sintered body. FIG. 9 is a view showing the heating pattern at the time of sintering. As shown in FIG. 9, the holding time was 700° C., and the holding time was 15 minutes. The degree of vacuum was −0.02 MPa, and the sintering pressure was 30 MPa. This sintered body was used as the thermoelectric material of Example 1.

Example 2

The thermoelectric material of Example 2 was prepared in the same manner as in Example 1 other than each of the Sn powder, the Mg powder, the Si powder, and the Zn powder was weighed to have the mass shown in Tables 1 and 2. The target composition is shown in Table 1, and the charge composition is shown in Table 2. The charge composition indicates the mass and molar ratio of each powder actually weighed. In Tables 1 and 2, other than Example 2, the target compositions and the charge compositions of Example 1 above and Examples 3 to 5 and Comparative Examples 1 to 5 below are also shown.

In each thermoelectric material, the amount of the Mg powder in the charge composition is larger than the amount of the Mg powder in the target composition, because depletion of the Mg powder in the process of manufacture is anticipated. With respect to the thermoelectric materials of Examples 1 and 3 and Comparative Example 1, the target composition was formulated so that all dopant elements can be present in the Si site. With respect to the thermoelectric materials of Examples 2, 4 and 5 and Comparative Examples 2 to 5, the target composition was formulated so that the dopant element can be present in the Si site and the Mg site.

In all of Examples 1 to 5 and Comparative Examples 1 to 5, the dopant element means both the first dopant element and the second dopant element.

TABLE 1

| | Target Composition Molar Ratio | | | | | |
|---|---|---|---|---|---|---|
| | Matrix | | | Dopant | | |
| | Mg | Si | Sn | Sb | Zn | Al |
| Example 1 | 2.000 | 0.364 | 0.600 | 0.024 | 0.012 | — |
| Example 2 | 1.988 | 0.364 | 0.600 | 0.024 | 0.024 | — |
| Example 3 | 2.000 | 0.364 | 0.600 | 0.024 | — | 0.012 |
| Example 4 | 1.988 | 0.364 | 0.600 | 0.024 | — | 0.024 |
| Example 5 | 1.976 | 0.364 | 0.600 | 0.024 | — | 0.036 |
| Comparative Example 1 | 2.000 | 0.364 | 0.600 | 0.024 | 0.012 | — |
| Comparative Example 2 | 1.988 | 0.364 | 0.600 | 0.036 | 0.012 | — |
| Comparative Example 3 | 1.988 | 0.364 | 0.600 | 0.012 | 0.036 | — |
| Comparative Example 4 | 1.988 | 0.364 | 0.600 | 0.036 | — | 0.012 |
| Comparative Example 5 | 1.988 | 0.364 | 0.600 | 0.012 | — | 0.036 |

Comparative Examples 1 to 3

The thermoelectric materials of Comparative Examples 1 to 3 were prepared in the same manner as in Example 1 other than the first mixed material and the first green compact were not prepared, the Mg powder, the Si powder, the Sn powder, and the Zn powder were simultaneously mixed to obtain a second mixed raw material, and the second mixed raw material was compression-molded to obtain a second green compact.

With respect to Comparative Examples 1 to 3, each of the Mg powder, the Si powder, the Sn powder, and the Zn powder was weighed to have the mass shown in Table 1. As regards the compression molding of the second mixed raw material, the second mixed raw material was charged into a mold and compression-molded in a pellet shape under a pressure of 100 MPa.

Comparative Examples 4 and 5

The thermoelectric material of Comparative Examples 4 and 5 were prepared in the same manner as in Comparative Example 1 other than the Zn powder was replaced by an Al powder and each of the Mg powder, the Si powder, the Sn powder, and the Al powder was weighed to have the mass shown in Table 1.

TABLE 2

| | Charge Composition | | | | | | | | | | | |
|---|---|---|---|---|---|---|---|---|---|---|---|---|
| | Mass (g) | | | | | | Molar Ratio | | | | | |
| | Matrix | | | Dopant | | | Matrix | | | Dopant | | |
| | Mg | Si | Sn | Sb | Zn | Al | Mg | Si | Sn | Sb | Zn | Al |
| Example 1 | 2.500 | 0.5055 | 3.5212 | 0.1445 | 0.0388 | — | 2.08 | 0.364 | 0.600 | 0.024 | 0.012 | — |
| Example 2 | 2.500 | 0.5055 | 3.5212 | 0.1445 | 0.0776 | — | 2.08 | 0.364 | 0.600 | 0.024 | 0.024 | — |
| Example 3 | 2.500 | 0.5055 | 3.5312 | 0.1445 | — | 0.0160 | 2.08 | 0.364 | 0.600 | 0.024 | — | 0.012 |
| Example 4 | 2.500 | 0.5055 | 3.5312 | 0.1445 | — | 0.0320 | 2.08 | 0.364 | 0.600 | 0.024 | — | 0.024 |
| Example 5 | 2.500 | 0.5055 | 3.5312 | 0.1445 | — | 0.0480 | 2.08 | 0.364 | 0.600 | 0.024 | — | 0.036 |
| Comparative Example 1 | 2.375 | 0.4803 | 3.3452 | 0.1373 | 0.0369 | — | 2.08 | 0.364 | 0.600 | 0.024 | 0.012 | — |
| Comparative Example 2 | 2.375 | 0.4803 | 3.3452 | 0.2000 | 0.0369 | — | 2.08 | 0.364 | 0.600 | 0.036 | 0.012 | — |
| Comparative Example 3 | 2.375 | 0.4803 | 3.3452 | 0.0687 | 0.1106 | — | 2.08 | 0.364 | 0.600 | 0.012 | 0.036 | — |
| Comparative Example 4 | 2.374 | 0.4800 | 3.3437 | 0.2057 | — | 0.0152 | 2.08 | 0.364 | 0.600 | 0.036 | — | 0.012 |
| Comparative Example 5 | 2.374 | 0.4803 | 3.3440 | 0.0687 | — | 0.0456 | 2.08 | 0.364 | 0.600 | 0.012 | — | 0.036 |

Examples 3 to 5

Figure 10:
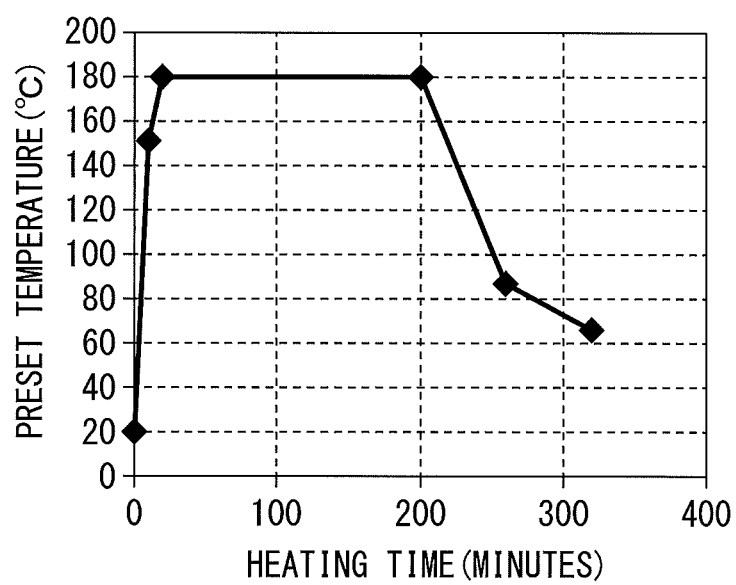
FIG. 10 A view showing a heating pattern of a first green compact in Examples 3 to 5.

The thermoelectric materials of Examples 3 to 5 were prepared in the same manner as in Example 1 other than the Zn powder was replaced by an Al powder, each of the Mg powder, the Si powder, the Sn powder, and the Al powder was weighed to have the mass shown in Table 1, and the first green compact was heated according to the pattern of FIG. 10. As for the Al powder, ALE11PB (purity: 99.9% (3N), average particle diameter: about 3 μm) produced by Kojundo Chemical Laboratory Co., Ltd. was used. As illustrated in FIG. 10, the holding temperature was 180° C., and the holding time was 3 hours. Since the eutectic temperature is 230° C. in a binary equilibrium phase diagram of Sn—Al system, it is considered that Al had solid-phase diffused into the Sn powder.

(Evaluation)

The thermoelectric materials of Examples 1 to 5 and Comparative Examples 1 to 5 were evaluated for the properties, particularly ZT, as described below.

(Resistivity and Seebeck Coefficient)

A test piece with a thickness of 2 mm and a size of 2 mm×9 mm was sampled from each of the thermoelectric materials of Examples 1 to 5 and Comparative Examples 1 to 5 and after polishing, measured for the resistivity and the Seebeck coefficient. In the measurement, thermoelectric evaluation system ZEM-3 manufactured by ADVANCE RIKO, Inc. was used. Both the resistivity and the Seebeck coefficient were measured at 500° C.

(Power Factor Pf)

The power factor Pf at 500° C. was calculated from the measured values of Seebeck coefficient and resistivity above. The calculation formula is as follows.

(Power factor Pf)=(Seebeck coefficient)$^2$/(resistivity)

(Thermal Diffusivity)

A test piece with a thickness of 2.1 mm and a size of 2.1 mm×2.1 mm was sampled from each of the thermoelectric materials of Examples 1 to 5 and Comparative Examples 1 to 5 and measured for the thermal diffusivity. In the measurement, LFA457 MicroFlash manufactured by NETZSCH was used.

(Density)

The density of each of the thermoelectric materials of Examples 1 to 5 and Comparative Examples 1 to 5 was measured by the Archimedes method. The measurement was performed at ordinary temperature.

(Specific Heat)

A test piece with a thickness of 2.1 mm and a size of 2.1 mm×2.1 mm was sampled from each of the thermoelectric materials of Examples 1 to 5 and Comparative Examples 1 to 5 and measured for the specific heat. In the measurement, DSC Q100 manufactured by TA Instruments was used. The measurement was performed at 500° C.

(Calculation of Thermal Conductivity)

The thermal conductivity at 500° C. was calculated from the measured values of thermal diffusivity, density and specific heat above.

(Thermal conductivity)=(thermal diffusivity)×(density)×(specific heat)

(Calculation of ZT)

Furthermore, ZT at 500° C. was calculated from the calculated values of power factor Pf and thermal conductivity above. The calculation formula is as follows.

(ZT)=((power factor Pf)/(thermal conductivity))×(absolute temperature T)

The evaluation results are shown in Table 3. In Table 3, the heating conditions (holding temperature and holding time) for the first green compact and the second green compact are shown together.

As shown in Table 2, in the thermoelectric materials of Examples 1 to 5 where Sn and the first dopant element were first mutually diffused and Mg, Si, Sn, the first dopant element and the second dopant element were thereafter mutually diffused, it could be confirmed that ZT is enhanced. On the other hand, as to the thermoelectric materials of Comparative Examples 1 to 5 where Mg, Si, Sn, and the dopant element are mutually diffused at the same time, it could be confirmed that ZT of the thermoelectric materials of Comparative Examples 1 to 5 is poor compared with the thermoelectric materials of Examples 1 to 5.

From these results, the present invention could be verified to provide prominent effects.

DESCRIPTION OF NUMERICAL REFERENCES

10 Second green compact
12 Carbon crucible
14 Quartz tube
16 On-off valve
18 Stainless steel-made pressure-resistant vessel

What is claimed is:

1. A method for producing a thermoelectric material, comprising:
   (a) mixing an Sn powder and a powder containing a first dopant element to obtain a first mixed raw material,
   (b) heating the first mixed raw material at a temperature allowing mutual diffusion of Sn and the first dopant element to obtain a first aggregate,
   (c) pulverizing the first aggregate to obtain a first powder,
   (d) mixing an Mg powder, an Si powder, a second dopant element, and the first powder to obtain a second mixed raw material
   (e) heating the second mixed raw material at a temperature allowing mutual diffusion of Mg, Si, Sn, the first dopant element, and the second dopant element to obtain a second aggregate,
   (f) pulverizing the second aggregate to obtain a second powder, and
   (g) pressure-sintering the second powder, and
   wherein
   the first dopant element is one or more elements selected from the group consisting of Al and Zn, and the second dopant element is Sb.

TABLE 3

| | Heating of First Green Compact | Heating of Second Green Compact | Resistivity at 500° C. ($\mu\Omega m$) | Seebeck Coefficient at 500° C. ($\mu V/K$) | Power Factor Pf at 500° C. ($mW/mK^2$) | Thermal Diffusivity at 500° C. ($m^2/s$) | Density ($g/cm^3$) | Specific Heat at 500° C. ($J/(gK)$) | Thermal Conductivity at 500° C. ($W/mK$) | ZT at 500° C. |
|---|---|---|---|---|---|---|---|---|---|---|
| Example 1 | 150° C. 3 hours | 700° C. 12 hours | 12.12 | −218 | 3.93 | 1.257 | 2.9659 | 0.55 | 2.05 | 1.48 |
| Example 2 | 150° C. 3 hours | 700° C. 12 hours | 10.01 | −207 | 4.27 | 1.282 | 3.0112 | 0.66 | 2.55 | 1.29 |
| Example 3 | 180° C. 3 hours | 700° C. 12 hours | 12.10 | −221 | 4.04 | 1.254 | 3.0306 | 0.50 | 1.91 | 1.64 |
| Example 4 | 180° C. 3 hours | 700° C. 12 hours | 14.95 | −239 | 3.83 | 1.118 | 3.0243 | 0.65 | 2.20 | 1.35 |
| Example 5 | 180° C. 3 hours | 700° C. 12 hours | 15.93 | −240 | 3.61 | 1.193 | 3.1287 | 0.59 | 2.20 | 1.27 |
| Comparative Example 1 | — | 700° C. 12 hours | 27.85 | −263 | 2.48 | 1.082 | 3.0493 | 0.61 | 2.01 | 0.95 |
| Comparative Example 2 | — | 700° C. 12 hours | 14.93 | −235 | 3.69 | 1.158 | 3.0702 | 0.69 | 2.45 | 1.16 |
| Comparative Example 3 | — | 700° C. 12 hours | 25.31 | −266 | 2.79 | 1.177 | 3.0293 | 0.60 | 2.14 | 1.01 |
| Comparative Example 4 | — | 700° C. 12 hours | 49.21 | −269 | 1.47 | 1.121 | 2.9923 | 0.71 | 2.38 | 0.48 |
| Comparative Example 5 | — | 700° C. 12 hours | 16.67 | −248 | 3.69 | 1.193 | 3.0213 | 0.69 | 2.49 | 1.15 |

* * * * *